(12) United States Patent
Bauer

(10) Patent No.: US 11,774,481 B2
(45) Date of Patent: Oct. 3, 2023

(54) ELECTRICAL SENSOR ASSEMBLY

(71) Applicant: G & W Electric Company, Bolingbrook, IL (US)

(72) Inventor: Alberto Bauer, Dubai (AE)

(73) Assignee: G & W ELECTRIC COMPANY, Bolingbrook, IL (US)

( * ) Notice: Subject to any disclaimer, the term of this patent is extended or adjusted under 35 U.S.C. 154(b) by 0 days.

(21) Appl. No.: 17/827,181

(22) Filed: May 27, 2022

(65) Prior Publication Data

US 2022/0357382 A1    Nov. 10, 2022

Related U.S. Application Data

(63) Continuation of application No. 17/414,891, filed as application No. PCT/US2019/066906 on Dec. 17, 2019, now Pat. No. 11,346,876.

(30) Foreign Application Priority Data

Dec. 17, 2018  (IT) ........................ 102018000011149
Dec. 17, 2018  (IT) ........................ 202018000003944

(51) Int. Cl.
*G01R 29/08*  (2006.01)
*G01R 15/14*  (2006.01)
(Continued)

(52) U.S. Cl.
CPC ....... *G01R 29/0878* (2013.01); *G01R 15/144* (2013.01); *G01R 29/12* (2013.01); *H01B 9/006* (2013.01)

(58) Field of Classification Search
CPC .. G01R 29/0878; G01R 15/144; G01R 15/16; G01R 15/165; G01R 29/12;
(Continued)

(56) References Cited

U.S. PATENT DOCUMENTS 3,396,339 A    8/1968  Miram
3,835,353 A    9/1974  Hermstein et al.
(Continued)

FOREIGN PATENT DOCUMENTS

CN    105588966 A    5/2016
CN    105467187 B    5/2018
(Continued)

OTHER PUBLICATIONS

International Preliminary Report on Patentability for Application No. PCT/IT2019/000023 dated Oct. 15, 2020 (7 pages).
(Continued)

*Primary Examiner* — Jermele M Hollington
*Assistant Examiner* — Suresh K Rajaputra
(74) *Attorney, Agent, or Firm* — Michael Best & Friedrich LLP

(57) ABSTRACT

A sensor assembly includes a connecting bar extending along a longitudinal axis and a tubular body extending along the longitudinal axis and at least partially surrounding the connecting bar such that the tubular body is radially spaced from the connecting bar. The tubular body includes a first skirt portion, a first plurality of cantilevered tabs extending from the first skirt portion in a first direction parallel to the longitudinal axis, a second skirt portion, and a second plurality of cantilevered tabs extending from the second skirt portion in a second direction opposite the first direction.

21 Claims, 4 Drawing Sheets

(51) Int. Cl.
  *G01R 29/12* (2006.01)
  *H01B 9/00* (2006.01)

(58) Field of Classification Search
  CPC .............. G01R 19/0092; G01R 1/203; G01R 31/2642; H01B 9/006; G06F 9/3802; G06F 2221/2137
  See application file for complete search history.

(56) References Cited

U.S. PATENT DOCUMENTS

| | | | |
|---|---|---|---|
| 4,241,373 A | 12/1980 | Mara et al. | |
| 4,268,889 A | 5/1981 | Wolfendale | |
| 4,700,123 A | 10/1987 | Beling | |
| 5,136,241 A | 8/1992 | Blank et al. | |
| 5,661,240 A | 8/1997 | Kemp | |
| 5,991,177 A | 11/1999 | Kaczkowski | |
| 6,252,388 B1 | 6/2001 | Jaeger et al. | |
| 6,307,385 B1 | 10/2001 | Tardif et al. | |
| 7,466,146 B2 | 12/2008 | Stewart et al. | |
| 7,541,816 B1 | 6/2009 | Liao et al. | |
| 7,595,648 B2 | 9/2009 | Ungaretti et al. | |
| 8,242,840 B2 | 8/2012 | Van Veldhoven | |
| 8,283,934 B2 | 10/2012 | Nishizono | |
| 8,294,477 B2 | 10/2012 | Handshoe et al. | |
| 8,446,157 B2 | 5/2013 | Fröjd | |
| 8,847,353 B2 | 9/2014 | Hasunuma | |
| 9,118,330 B2 | 8/2015 | Beyly et al. | |
| 9,291,651 B2 | 3/2016 | Bauer | |
| 9,389,246 B2 | 7/2016 | Juds et al. | |
| 9,568,506 B2 | 2/2017 | Fujinoki | |
| 9,696,348 B2 | 7/2017 | Juds et al. | |
| 9,739,807 B2 | 8/2017 | Barba Jimenez | |
| 9,739,816 B2 | 8/2017 | Flanagan | |
| 9,739,820 B2 | 8/2017 | Gravermann et al. | |
| 9,742,180 B2 | 8/2017 | Wentzel et al. | |
| 9,846,024 B1 | 12/2017 | Noras | |
| 9,921,246 B2 | 3/2018 | Bauer | |
| 9,927,415 B2 | 3/2018 | Baumann et al. | |
| 9,958,505 B2 | 5/2018 | Honda | |
| 9,983,032 B1 | 5/2018 | Kraver et al. | |
| 10,025,423 B2 | 7/2018 | Aas et al. | |
| 10,088,963 B2 | 10/2018 | Otagaki et al. | |
| 10,203,814 B2 | 2/2019 | Ryynanen et al. | |
| 10,215,778 B2 | 2/2019 | Gravermann et al. | |
| 10,317,442 B2 | 6/2019 | Kawaguchi et al. | |
| 10,338,103 B2 | 7/2019 | Gravermann et al. | |
| 10,345,340 B2 | 7/2019 | Gravermann et al. | |
| 10,425,079 B1 | 9/2019 | Bytheway | |
| 10,591,523 B2 | 3/2020 | Pak et al. | |
| 10,753,962 B2 | 8/2020 | Testa et al. | |
| 10,790,822 B2 | 9/2020 | Wendt et al. | |
| 11,048,367 B2 | 6/2021 | Reynolds et al. | |
| 11,079,410 B2 | 8/2021 | Bauer et al. | |
| 11,287,456 B2 | 3/2022 | Wang et al. | |
| 11,340,266 B2* | 5/2022 | Bauer | G01R 29/12 |
| 11,346,876 B2* | 5/2022 | Bauer | H01B 9/006 |
| 11,378,594 B2 | 7/2022 | Djogo | |
| 11,415,611 B2 | 8/2022 | Zhang et al. | |
| 2001/0048308 A1 | 12/2001 | Potter et al. | |
| 2002/0113596 A1 | 8/2002 | Horie et al. | |
| 2005/0122118 A1 | 6/2005 | Zank et al. | |
| 2006/0033508 A1 | 2/2006 | Lee | |
| 2006/0119369 A1 | 6/2006 | Kawahata et al. | |
| 2006/0238233 A1 | 10/2006 | Kraus | |
| 2007/0086130 A1 | 4/2007 | Sorensen | |
| 2008/0011093 A1 | 1/2008 | Shank et al. | |
| 2010/0107775 A1 | 5/2010 | Wang et al. | |
| 2010/0283487 A1 | 11/2010 | Juds et al. | |
| 2010/0318306 A1 | 12/2010 | Tierney et al. | |
| 2011/0012623 A1 | 1/2011 | Gastel et al. | |
| 2011/0121820 A1 | 5/2011 | Handshoe et al. | |
| 2011/0121842 A1 | 5/2011 | Bauer et al. | |
| 2011/0204879 A1 | 8/2011 | Peretto | |
| 2011/0205683 A1 | 8/2011 | Peretto | |
| 2011/0221452 A1 | 9/2011 | Shyue | |
| 2011/0234311 A1 | 9/2011 | Hirashiki et al. | |
| 2011/0298454 A1 | 12/2011 | Ausserlechner | |
| 2012/0261384 A1 | 10/2012 | Labianco et al. | |
| 2012/0326734 A1 | 12/2012 | Cho et al. | |
| 2013/0043891 A1 | 2/2013 | Handshoe et al. | |
| 2014/0300374 A1 | 10/2014 | Mckenzie et al. | |
| 2014/0354302 A1 | 12/2014 | Lu et al. | |
| 2014/0370741 A1 | 12/2014 | Bolcato et al. | |
| 2015/0279642 A1 | 10/2015 | Prance | |
| 2015/0346907 A1 | 12/2015 | Nakajima et al. | |
| 2016/0005511 A1 | 1/2016 | Gravermann et al. | |
| 2016/0061864 A1 | 3/2016 | White et al. | |
| 2016/0103174 A1 | 4/2016 | Aaltonen et al. | |
| 2016/0139181 A1 | 5/2016 | Gravermann et al. | |
| 2016/0202286 A1 | 7/2016 | Aaltonen et al. | |
| 2016/0245845 A1* | 8/2016 | Alberto | G01R 3/00 |
| 2017/0030946 A1 | 2/2017 | Gravermann et al. | |
| 2017/0038414 A1 | 2/2017 | Barba Jimenez | |
| 2017/0061187 A1 | 3/2017 | Wen | |
| 2017/0067938 A1 | 3/2017 | Kasai | |
| 2017/0067939 A1 | 3/2017 | Imai et al. | |
| 2017/0184634 A1 | 6/2017 | Wentzel | |
| 2017/0234908 A1 | 8/2017 | Gravermann et al. | |
| 2017/0250499 A1 | 8/2017 | Sica et al. | |
| 2017/0276723 A1 | 9/2017 | Buffa et al. | |
| 2017/0363660 A1 | 12/2017 | Gravermann | |
| 2018/0092557 A1 | 4/2018 | Bickford et al. | |
| 2018/0100878 A1 | 4/2018 | Pearce et al. | |
| 2018/0292435 A1 | 10/2018 | Wentzel et al. | |
| 2018/0374644 A1 | 12/2018 | Stollwerck et al. | |
| 2019/0146006 A1 | 5/2019 | Sanchez Ruiz et al. | |
| 2019/0181860 A1 | 6/2019 | Cholasta | |
| 2019/0234995 A1* | 8/2019 | Peretto | G01R 15/165 |
| 2019/0237260 A1 | 8/2019 | Stollwerck et al. | |
| 2019/0324073 A1 | 10/2019 | Mikami | |
| 2020/0064376 A1 | 2/2020 | Loyd et al. | |
| 2020/0124642 A1 | 4/2020 | Djogo | |
| 2020/0158762 A1 | 5/2020 | Wilson et al. | |
| 2020/0200936 A1 | 6/2020 | Kruger | |
| 2020/0256896 A1 | 8/2020 | Bauer et al. | |
| 2021/0018537 A1 | 1/2021 | Bauer | |
| 2021/0072289 A1* | 3/2021 | Peretto | G01R 15/165 |
| 2021/0206418 A1 | 7/2021 | Nakano et al. | |
| 2021/0302478 A1 | 9/2021 | Kapoor et al. | |
| 2021/0356499 A1 | 11/2021 | Ferraro et al. | |
| 2021/0359533 A1 | 11/2021 | Hatano | |
| 2022/0043033 A1 | 2/2022 | Bauer | |
| 2022/0065910 A1 | 3/2022 | Ellis, Jr. et al. | |
| 2022/0123748 A1 | 4/2022 | Willis et al. | |
| 2022/0311441 A1 | 9/2022 | Liu | |
| 2022/0317158 A1 | 10/2022 | Stollwerck et al. | |

FOREIGN PATENT DOCUMENTS

| | | |
|---|---|---|
| DE | 2149881 A1 | 2/1973 |
| DE | 19613688 A1 | 10/1997 |
| DE | 102017000723 A1 | 8/2018 |
| EP | 0677747 A2 | 10/1995 |
| EP | 0912902 A1 | 5/1999 |
| EP | 2993480 A1 | 3/2016 |
| EP | 3513202 A1 | 7/2019 |
| EP | 3828553 A1 | 6/2021 |
| EP | 3840135 A1 | 6/2021 |
| EP | 3862760 A1 | 8/2021 |
| EP | 3913379 A1 | 11/2021 |
| EP | 3881085 A4 | 7/2022 |
| EP | 1058815 A1 | 9/2022 |
| ES | 2221551 A1 | 12/2004 |
| GB | 967853 A | 8/1964 |
| GB | 2203557 A | 10/1988 |
| WO | 2009153824 A1 | 12/2009 |
| WO | 2010070693 A1 | 6/2010 |
| WO | 2011033548 A1 | 3/2011 |
| WO | 2011125725 A1 | 10/2011 |
| WO | 2011157047 A8 | 1/2013 |
| WO | 2013026423 A1 | 2/2013 |
| WO | 2013042155 A2 | 3/2013 |
| WO | 2016109009 A1 | 7/2016 |

(56) References Cited

FOREIGN PATENT DOCUMENTS

| WO | 2017050039 A1 | 3/2017 |
| WO | 2017050042 A1 | 3/2017 |
| WO | 2017050044 A1 | 3/2017 |
| WO | 2017050045 A1 | 3/2017 |
| WO | 2017050058 A1 | 3/2017 |
| WO | 2018069949 A2 | 4/2018 |
| WO | 2018096567 A2 | 5/2018 |
| WO | 2018114661 A1 | 6/2018 |
| WO | 2019073497 A1 | 4/2019 |
| WO | 2019186607 A1 | 10/2019 |
| WO | 2020109283 A2 | 6/2020 |
| WO | 2020131903 A1 | 6/2020 |
| WO | 2021061153 A1 | 4/2021 |
| WO | 2021180642 A1 | 9/2021 |
| WO | 2022069967 A1 | 4/2022 |
| WO | 2022072130 A1 | 4/2022 |
| WO | 2022094645 A1 | 5/2022 |
| WO | 2022124942 A1 | 6/2022 |

OTHER PUBLICATIONS

International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).
European Patent Office. Extended European Search Report for application 19900168.6, dated Sep. 27, 2022 (10 pages).
International Search Report and Written Opinion for Related Application No. PCT/IT2017/000225 dated May 4, 2018 (11 pages).
International Search Report and Written Opinion for Related Application No. PCT/IT2018/000037 dated Jul. 17, 2018 (9 pages).

\* cited by examiner

ELECTRICAL SENSOR ASSEMBLY

CROSS-REFERENCE TO RELATED APPLICATIONS

This application is a continuation of co-pending U.S. patent application Ser. No. 17/414,891, filed Jun. 16, 2021, which is a national phase application of International Patent Application No. PCT/US2019/066906, filed Dec. 17, 2019, which claims priority to Italian Patent Application No. 102018000011149, filed Dec. 17, 2018, and to Italian Utility Model Application No. 202018000003944, filed Dec. 17, 2018, the entire contents of all of which are incorporated herein by reference.

FIELD OF THE DISCLOSURE

The present disclosure relates to an electrical sensor assembly, preferably intended for electrical transformers, electrical cabinets and other similar structures, that enables the electric field generated by a live connecting bar to be detected, for example to detect the voltage value of said connecting bar in relation to the detected electric field.

More specifically, the present disclosure relates to a sensor assembly that may detect the electric field generated by the connecting bar without being influenced by any surrounding electrical fields, such as the fields generated by other conductors arranged nearby.

BACKGROUND

Electrical sensor assemblies of the aforementioned type are known, but suffer from a series of drawbacks.

A first drawback is that said known sensor assemblies do not enable the electric field generated by the connecting bar to be detected without being influenced by other surrounding fields.

A second drawback is that said known sensor assemblies are somewhat large.

A third drawback is that said known sensor assemblies do not enable electrical fields and/or related magnitudes to be measured with sufficient accuracy.

A fourth drawback is that said known sensor assemblies are not immune to surrounding electrical fields generated, for example, by other conductors arranged nearby.

A fifth drawback is that said known sensor assemblies do not enable electrical fields and/or related magnitudes to be measured with sufficient accuracy in the presence of temperature variations.

A sixth drawback is that said known sensor assemblies do not retain over time the technical features required to perform the function of the sensor assembly and/or to maintain the required safety level (partial discharges, detachment, rapid ageing, etc.).

A seventh drawback is that said known sensor assemblies are complex and costly to make.

An eighth drawback is that, in said known sensor assemblies, the resin of dielectric material placed about the components of the sensor assembly have cavities (air bubbles), which results in unwanted partial discharging.

A ninth drawback is that, in said known sensor assemblies, said resin is detached from the elements that comprise the capacitive sensor, which results in unwanted partial discharging.

A tenth drawback is that, in said known sensor assemblies, said resin is not perfectly bonded and/or stuck and/or linked to the components that form the sensor assembly and consequently, ageing causes said resin to become detached from said members, which results in unwanted partial discharging. This drawback is particularly common where the sensor assembly is used in an environment in which the operating temperature (hot/cold) varies cyclically.

SUMMARY

Sensor assemblies according to embodiments of the present disclosure may advantageously resolve one or more of the aforementioned drawbacks.

For example, the present disclosure provides, in one aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a first skirt portion, a first plurality of cantilevered tabs extending from the first skirt portion in a first direction parallel to the longitudinal axis, a second skirt portion, and a second plurality of cantilevered tabs extending from the second skirt portion in a second direction opposite the first direction.

The present disclosure provides, in another aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material, the support member including an inner surface and an outer surface opposite the inner surface, an electric field sensor comprising a first layer of electrically conductive material disposed on the inner surface of the support member, the electric field sensor configured to detect an electric field produced by the connecting bar, a first electric screen comprising a second layer of electrically conductive material disposed on the outer surface of the support member, the first electric screen configured to shield the electric field sensor from outside electrical interference, and a plurality of cantilevered tabs having a first tab and a second tab spaced from the first tab to define a through hole therebetween. The through hole extends through support member, the first layer, and the second layer.

The present disclosure provides, in another aspect, a sensor assembly including a tubular body extending along a longitudinal axis. The tubular body includes a support member made of an insulating material, a first layer of electrically conductive material disposed on an inner surface of the support member, a second layer of electrically conductive material disposed on an outer surface of the support member, a first skirt portion, a first plurality of cantilevered tabs extending from the first skirt portion in a first direction parallel to the longitudinal axis, a second skirt portion, a second plurality of cantilevered tabs extending from the second skirt portion in a second direction opposite the first direction, and a connecting segment extending between and interconnecting the first skirt portion and the second skirt portion.

Other features and aspects of the disclosure will become apparent by consideration of the following detailed description and accompanying drawings.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
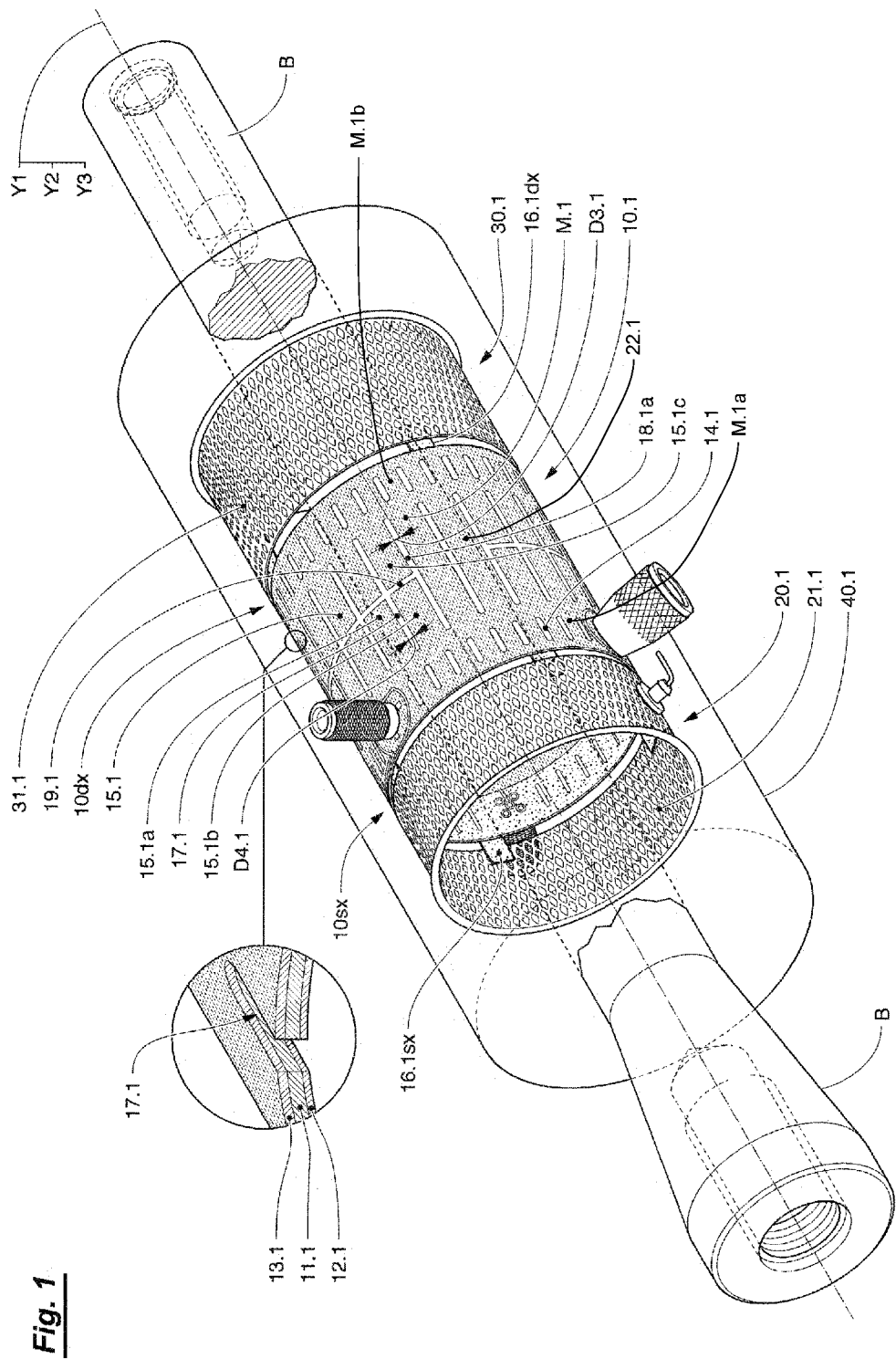
FIG. 1 is a schematic view of a first embodiment of a sensor assembly according to the present disclosure.
Figure 2:
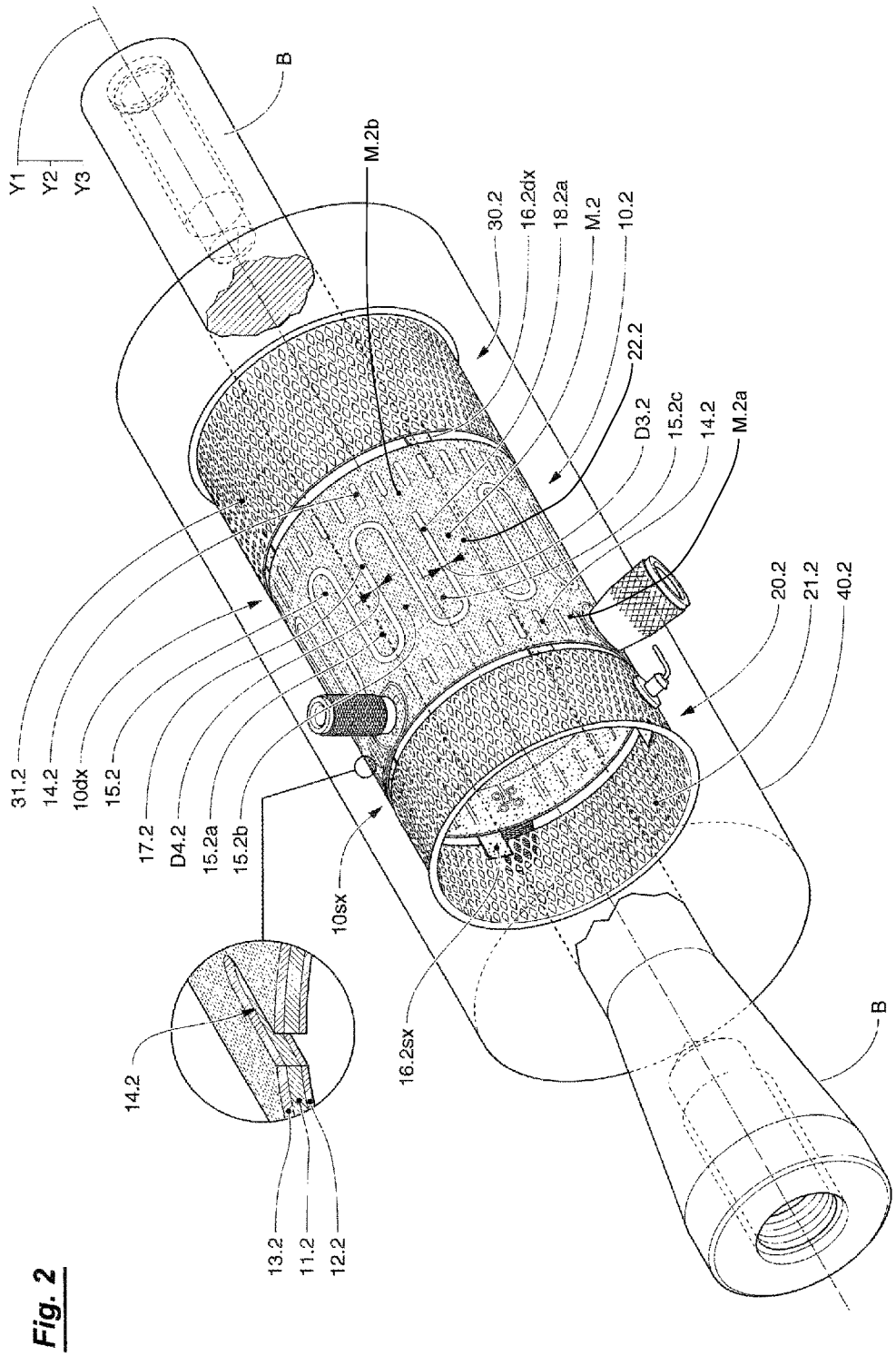
FIG. 2 is a schematic view of a second embodiment of a sensor assembly according to the present disclosure.
Figure 2A:
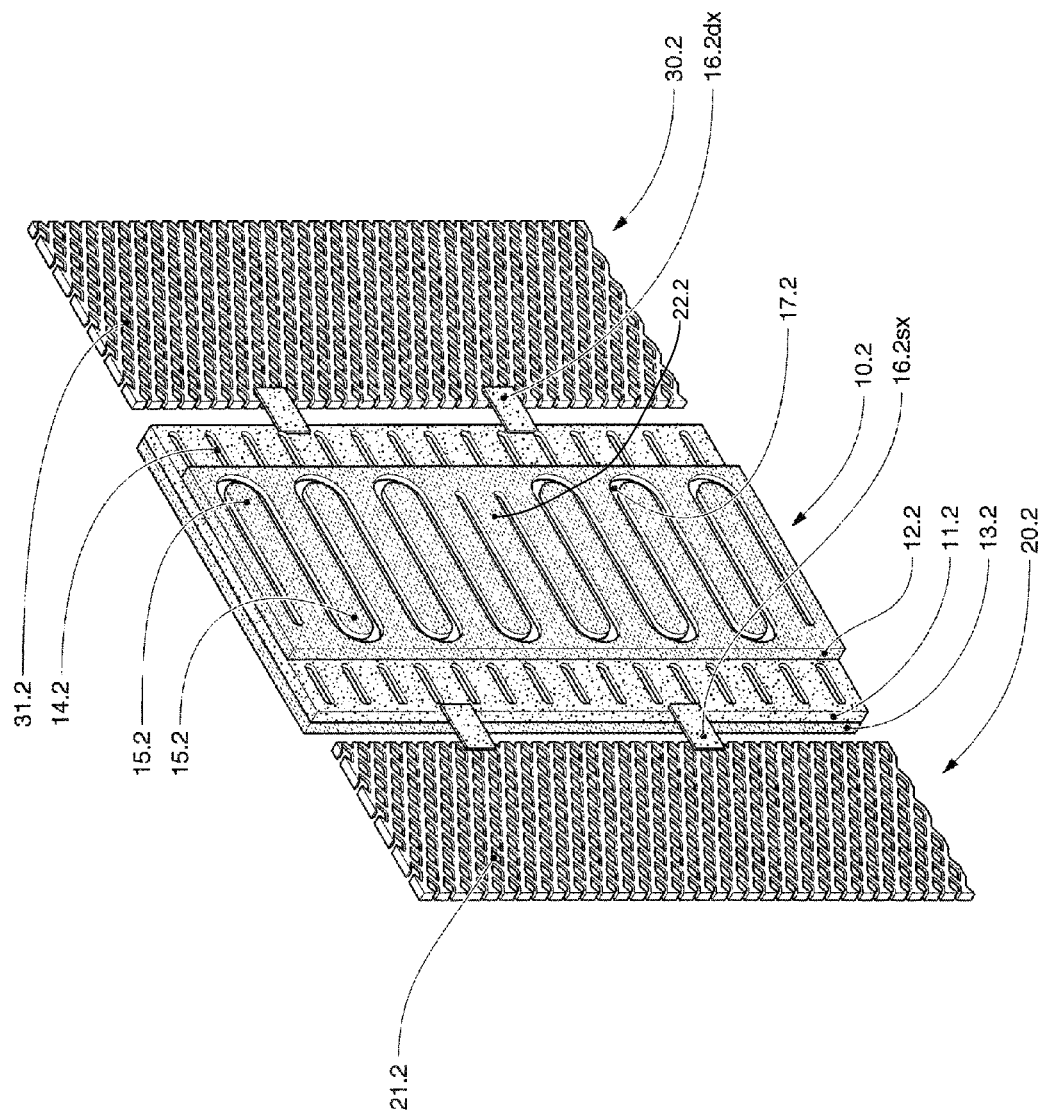
FIG. 2A is a schematic view of a tubular body in the embodiment in FIG. 2, laid flat.

With reference to FIGS. 1-2A, an electrical sensor assembly according to embodiments of the present disclosure extends along a first longitudinal axis Y1 and substantially comprises: a connecting bar B extending longitudinally along a respective second longitudinal axis Y2; a tubular body extending longitudinally along a third longitudinal axis Y3; a mass of dielectric material 40 designed to at least partially enclose the components of the sensor assembly; in which the tubular body is positioned coaxially about said central connecting bar B and is spaced radially apart from said central connecting bar B; in which said tubular body has one or more cantilevered tabs 15.1, 15.1a, 15.1b, 15.1c/15.2, 15.2a, 15.2b, 15.2c.

Particular reference is made to said tubular body, which can include a first tubular section 10.1/10.2 comprising: a first self-supporting tubular laminar element or structural member 11.1/11.2 made of insulating material, a first thin layer of electrically conductive material 12.1/12.2 applied to one or more inner faces of said first self-supporting tubular laminar element 11.1/11.2; and a second thin layer of electrically conductive material 13.1/13.2 applied to one or more outer faces of said first self-supporting tubular laminar element 11.1/11.2.

The first self-supporting tubular laminar element 11.1/11.2 may function as a supporting structure for the layers of conductive material. The first thin layer of electrically conductive material 12.1/12.2 may function as an electric field sensor and, more specifically, may detect the electric field generated by the connecting bar B by means of capacitive coupling between said bar B and said layer 12.1/12.2.

The second thin layer of electrically conductive material 13.1/13.2 may function as an electric screen, for example by connecting to ground or to a known potential, and, more specifically, an electric screen able to shield or screen the electric field sensor formed by the first thin layer of electrically conductive material 12.1/12.2 from external electric fields, such as from electric field lines generated by any live conductors arranged outside the tubular body.

Said tubular body and/or said first tubular section 10.1/10.2 can include a skirt M.1/M.2 and a plurality of cantilevered tabs 15.1/15.2 extending from the skirt M.1/M.2. In the illustrated embodiment, the skirt M.1/M.2 includes a first skirt portion M.1a/M.2a and a second skirt portion M.1b/M.2b disposed at opposite ends of the first tubular section 10. One or more cantilevered tabs 15.1, 15.1a, 15.1b/5.2b (e.g., a first plurality of tabs) may extend from the first skirt portion M.1a/M.2a in a first direction parallel to the axes Y1/Y2/Y3, and one or more cantilevered tabs 15.1c/15.2a, 15.2c (e.g., a second plurality of tabs) may extend from the second skirt portion M.1b/M.2b in a second direction generally opposite the first direction (FIGS. 1 and 2). In some embodiments, the tubular body and/or the first tubular section 10.1/10.2 may include one or more connecting segments 22.1/22.2 that extend between and interconnect the first and second skirt portions M.1a, M.1b/M.2a, M.2b.

The edges of said tabs 15.1c/15.2c are spaced apart by a distance D3.1/D3.2 from the connecting segments 22.1/22.2 in order to form first through-openings 18.1a/8.2a, which are preferably wide enough to enable a resin of dielectric material in liquid/paste state to pass and/or flow therethrough.

The tabs 15.1a, 15.1b/5.2a, 15.2b can be positioned side by side, as illustrated in FIGS. 2-2A, in which preferably the edge of a first tab 15.1a/5.2a is spaced apart by a distance D4.1/D4.2 circumferentially from the edge of a second tab 15.1b/5.2b positioned beside said first tab 15.1a/5.2a, in order to form second through-openings 17.1/17.2, which are preferably wide enough to enable a resin of dielectric material in liquid/paste state to pass and/or flow through said second through-openings 17.1/17.2.

Figure 1A:
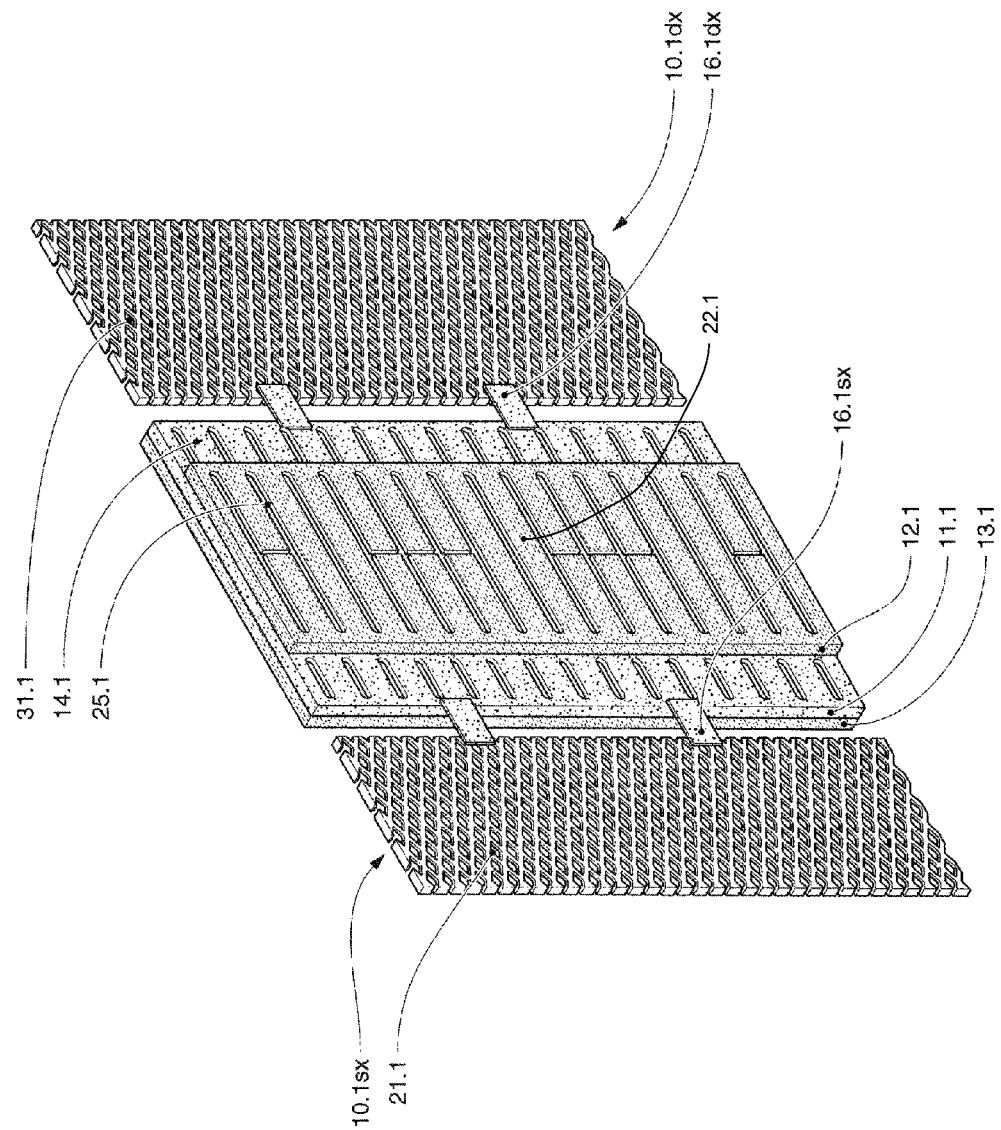
FIG. 1A is a schematic view of a tubular body in the embodiment in FIG. 1, laid flat.

With reference to FIGS. 1 and 1A, the tabs 15.1b and 15.1c can be positioned against one another, with the respective free ends thereof arranged end-to-end and preferably spaced apart axially from one another, in order to form third through-openings 19.1, which are preferably wide enough to enable a resin of dielectric material in liquid/paste state to pass and/or flow through said third through-openings 19.1.

With reference to FIGS. 2 and 2A, the tabs 15.2a, 15.2b, 15.2c can be positioned side by side, with the respective free ends thereof positioned against one another, in which the respective free end of one or more tabs 15.2a, 15.2b, 15.2c is rounded.

With reference to FIGS. 1-2A, said tabs 15.1, 15.1a, 15.1b, 15.1c/15.2, 15.2a, 15.2b, 15.2c are preferably flexible and also preferably have a degree of flexibility selected in consideration of the shrinkage characteristics of the resin used in the casting, in order to follow the shrinkage of the resin during the solidification phases of said resin.

The tubular body provided with cantilevered tabs 15.1, 15.1a, 15.1b, 15.1c/15.2, 15.2a, 15.2b, 15.2c can be made in a variety of ways and/or using a variety of materials without thereby moving outside the scope of the inventive concepts covered by the present disclosure, for example using preformed tubes with one or more layers that are subjected to mechanical machining to form the tabs, using individual sheets and/or one or more sheets, of metal, of mesh, using electrically conductive material or electrically insulating material.

With particular reference to FIGS. 1A and 2A, the first tubular section 10.1/10.2 can preferably be made from a single conductive double-sided Vetronite board (for example a copper double-sided Vetronite board—PCB), for example etched by photoengraving or mechanical milling, as shown in FIGS. 1A and 2A, and then wrapped into a tube shape, as shown in FIGS. 1 and 2, in which said conductive double-sided Vetronite board (for example a copper double-sided Vetronite board—PCB) includes a Vetronite lamina 11.1/11.2 able to form the self-supporting tubular body, an inner layer 12.1/12.2 of conductive material able to form the electric field sensor, and an outer layer 13.1/13.2 of conductive material, preferably connected to ground, able to form an electric screen.

The sensor assembly according to the present disclosure can also include a second tubular section 20.1/20.2 that may function as an electric screen and is positioned axially beside a first axial end 10sx of the first tubular section 10.1/10.2, as well as a third tubular section 30.1/30.2 that is also able to perform the function of an electric screen and is positioned axially beside a second axial end 10dx of the first tubular section 10.1/10.2.

Said second tubular section 20.1/20.2 and/or said third tubular section 30.1/30.2 can be made of wire mesh. Preferably, said second tubular section 20.1/20.2 and/or said third tubular section 30.1/30.2 are associated with and/or linked to said first tubular section 10.1/10.2 using connection members, such as fastening appendages 16.1sx, 16.1dx/16.2sx, 16.2dx.

Where desired, said first tubular section 10.1/10.2 and/or said second tubular section 20.1/20.2 and/or said third tubular section 30.1/30.2 can have one or more additional fourth through-openings, 14.1, 21.1, 31.1/14.2, 21.2, 31.2, which are preferably wide enough to enable a resin of dielectric material in liquid/paste state to pass through said additional fourth through-openings. Again where desired, said second tubular section 20.1/20.2 and/or said third tubular section 30.1/30.2 can also perform the function of an electric field sensor able to detect the presence or absence of voltage on the connecting bar B.

Although the disclosure has been described in detail with reference to certain preferred embodiments, variations and modifications exist within the scope and spirit of one or more independent aspects of the disclosure as described. In addition, some aspects of the present disclosure may include, but are not limited to:

Aspect 1. A sensor assembly relating to a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40) able to incorporate at least partially the components of the sensor assembly; wherein said tubular body is positioned coaxially around said central connecting bar (B); wherein said tubular body is radially spaced with respect to said central connecting bar (B); characterized by the fact that said tubular body comprises one or more tabs (15.1, 15.1a, 15.1b, 15.1c/15.2, 15.2a, 15.2b, 15.2c) supported in a cantilever manner.

Aspect 2. A sensor assembly relating to a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40) able to incorporate at least partially the components of the sensor assembly; wherein said tubular body is positioned coaxially around said central connecting bar (B); wherein said tubular body is radially spaced with respect to said central connecting bar (B); characterized by the fact that said tubular body comprises a first tubular section (10.1/10.2) comprising: a first self-supporting tubular laminar element (11.1/11.2) made of insulating material; a first thin layer of electrically conductive material (12.1/12.2) applied on one or more inner faces of said first self-supporting tubular laminar element (11.1/11.2); a second thin layer of electrically conductive material (13.1/13.2) applied on one or more external faces of said first self-supporting tubular laminar element (11.1/11.2); by the fact that said first self-supporting tubular laminar element (11.1/11.2) is adapted to perform the function of supporting structure; by the fact that said first thin layer of electrically conductive material (12.1/12.2) may function as an electric field sensor; by the fact that said second thin layer of electrically conductive material (13.1/13.2) may function as an electric screen; and by the fact that said first tubular section (10.1/10.2) comprises one or more tabs (15.1, 15.1a, 15.1b, 15.1c/15.2, 15.2a, 15.2b, 15.2c) supported in an cantilever manner.

Aspect 3. A sensor assembly according to aspect 1 or 2, characterized by the fact that said tabs (15.1c/15.2c) have their edge spaced (D3.1, D3.2) with respect to the skirt (M.1, M.2) which forms the relative tubular section (10.1, 10.2) in order to form first through openings (18.1a, 18.2a).

Aspect 4. A sensor assembly according to aspect 1 or 2, characterized by the fact to comprise two or more tabs (15.1a, 15.1b/5.2a, 15.2b) positioned side by side to each other.

Aspect 5. A sensor assembly according to aspect 4, characterized by the fact that the edge of a first tab (15.1a/5.2a) is spaced (D4.1, D4.2) with respect to the edge of a second tab (15.1b/5.2b) positioned next the said first tab (15.1a/5.2a) in order to form second through openings (17.1/17.2).

Aspect 6. A sensor assembly according to aspect 1 or 2, characterized by the fact to comprise at least two tabs (15.1b, 15.1c) positioned opposite each other with their respective free ends arranged head to head.

Aspect 7. A sensor assembly according to aspect 6, characterized by the fact that the free ends of said two tabs (15.1b, 15.1c) are spaced apart in order to form third through openings (19.1).

Aspect 8. A sensor assembly according to aspect 1 or 2, characterized in that of comprising at least two tabs (15.2a, 15.2b) positioned side by side with the respective free ends arranged opposite each other.

Aspect 9. A sensor assembly according to aspect 1 or 2, characterized in that one or more tabs (15.2) have their respective free ends rounded.

Aspect 10. A sensor assembly according to one of the preceding aspects, characterized in that said tabs (15.1/15.2) are flexible.

Aspect 11. A sensor assembly according to one of the preceding aspects, characterized in that said first tubular section (10.1/10.2) is made by means of a preformed double-sided plain copper PCB.

Aspect 12. A sensor assembly according to one of the previous aspects, characterized by the fact to further comprising a second tubular section (20.1/20.2); by the fact that said second tubular section (20.1/20.2) is positioned axially at the side of a first axial end (10sx) of the first tubular section (10.1/10.2); and by the fact that said second tubular section (20.1/20.2) may function as an electric screen.

Aspect 13. A sensor assembly according to one of the preceding aspects, characterized by the fact that it further comprises a third tubular section (30.1/30.2); by the fact that said third tubular section (30.1/30.2) is positioned axially at the side of a second axial end (10dx) of the first tubular section (10.1/10.2); and by the fact that said third tubular section (30.1/30.2) may function as an electric screen.

Aspect 14. A sensor assembly according to aspect 12 or 13, characterized by the fact that said second tubular section (20.1/20.2) and/or said third tubular section (30.1/30.2) are associated with said first tubular section (10.1/10.2).

Aspect 15. A sensor assembly according to one of aspects 1 to 14, characterized by the fact said second tubular section (20.1 1 20.2) and/or said third tubular section (30.1 1 30.2) are made by wire mesh.

Various features of the disclosure are set forth in the following claims.

What is claimed is:

1. A sensor assembly comprising:
an electrode extending along a longitudinal axis;
a flexible tubular section extending along the longitudinal axis and at least partially surrounding the electrode such that the flexible tubular section is spaced in a direction radially outward from the longitudinal axis and from a portion of the electrode, the flexible tubular section including
a support member made of an insulating material,
an electric field sensor comprising a first layer of electrically conductive material disposed on an inner surface of the support member, the electric field sensor configured to detect an electric field produced by the electrode, wherein the first layer includes
a first plurality of cantilevered tabs extending from a first portion of the first layer of electrically conductive material in a first direction parallel to the longitudinal axis, and
a second plurality of cantilevered tabs extending from a second portion of the first layer of electrically conductive material in a second direction parallel to the longitudinal axis opposite the first direction; and
a dielectric material at least partially enclosing the electrode and the flexible tubular section, wherein the dielectric material fills through openings in the flexible tubular section.

2. The sensor assembly of claim 1, further comprising a first electric screen comprising a second layer of electrically conductive material disposed on an outer surface of the support member, the first electric screen configured to shield the electric field sensor from outside electric interference.

3. The sensor assembly of claim 2, wherein the flexible tubular section is a first tubular section, and wherein the sensor assembly further comprises a second tubular section including an electric screen positioned axially adjacent an end of the first tubular section.

4. The sensor assembly of claim 1, wherein the flexible tubular section is a first tubular section, and wherein the sensor assembly further comprises a second tubular section including a wire mesh electric screen and positioned axially adjacent an end of the flexible tubular section.

5. The sensor assembly of claim 1, wherein the flexible tubular section includes a printed circuit board.

6. The sensor assembly of claim 1, wherein each cantilevered tab of the first plurality of cantilevered tabs is positioned between a pair of cantilevered tabs of the second plurality of cantilevered tabs to form through openings between each adjacent pair of cantilevered tabs.

7. The sensor assembly of claim 1, wherein an axial length of the first layer of electrically conductive material is less than an axial length of the support member.

8. The sensor assembly of claim 1, wherein the through openings of the flexible tubular section are configured as elongated slits.

9. A sensor assembly comprising:
an electrode extending along a longitudinal axis;
a first flexible tubular section extending along the longitudinal axis and at least partially surrounding the electrode such that the first flexible tubular section is spaced radially outward from the axis and from a portion of the electrode, the first tubular section including
a self-supporting member made of an insulating material,
an electric field sensor comprising a first layer of electrically conductive material disposed on an inner surface of the first self-supporting member, the electric field sensor configured to detect an electric field produced by the electrode, and
a first electric screen comprising a second layer of electrically conductive material disposed on an outer surface of the self-supporting member, the first electric screen electrically isolated from the electric field sensor and configured to shield the electric field sensor from outside electric interference,
wherein an axial length of the first layer of electrically conductive material is less than an axial length of the self-supporting member and less than an axial length of the second layer of electrically conductive material;
a second tubular section including a second electric screen positioned axially adjacent an end of the first flexible tubular section; and
a dielectric material at least partially enclosing the electrode, the first flexible tubular section, and the second tubular section, wherein the dielectric material fills through openings in the first flexible tubular section and the second tubular section, and wherein the each through opening in the first flexible tubular section is configured as an elongated slit having an axial length that extends in a direction parallel to the longitudinal axis.

10. The sensor assembly of claim 9, wherein the second tubular section includes wire mesh.

11. The sensor assembly of claim 9, wherein the first flexible tubular section includes a printed circuit board.

12. A sensor assembly comprising:
an electrode extending along a longitudinal axis;
a flexible tubular section extending along the longitudinal axis and at least partially surrounding the electrode such that the flexible tubular section is spaced in a direction radially outward from the longitudinal axis and from a portion of the electrode, the flexible tubular section comprising a flexible printed circuit board and including
a first layer of insulating material,
a second layer of electrically conductive material disposed radially inwardly from the first layer of insulating material, and
a third layer of electrically conductive material disposed radially outwardly from the first layer of insulating material; and
a dielectric material at least partially enclosing the electrode and the flexible tubular section, wherein the dielectric material is molded around and through the flexible tubular section to fill through openings in the flexible tubular section.

13. The sensor assembly of claim 12, wherein the first layer of electrically insulating material has a first length extending in a direction parallel to the longitudinal axis and the third layer of electrically conductive material has a second length extending in a direction parallel to the longitudinal axis, and wherein the first length is coextensive with the second length.

14. The sensor assembly of claim 12, wherein the second layer of electrically conductive material is configured to detect an electric field produced by the electrode, and wherein the third layer of electrically conductive material is configured to shield the second layer of electrically conductive material from outside electrical interference.

15. The sensor assembly of claim 12, wherein the flexible tubular section includes a plurality of flexible cantilevered tabs circumferentially spaced apart around the flexible tubular section and extending parallel to the longitudinal axis, wherein a through opening is formed between each pair of adjacent cantilevered tabs of the plurality of cantilevered tabs.

16. The sensor assembly of claim 12, wherein an axial length of the second layer of electrically conductive material is less than an axial length of the first layer of electrically insulating material and less than an axial length of the third layer of electrically conductive material.

17. The sensor assembly of claim 12, wherein the first layer made of electrically insulating material includes a first plurality of through openings each configured as an elongated slit that has a length extending in a direction parallel to the longitudinal axis, the second layer of electrically conductive material includes a second plurality of through openings each configured as an elongated slit that has a length extending in a direction parallel to the longitudinal axis, and the third layer of electrically conductive material includes a third plurality of through openings each configured as an elongated slit that has a length extending in a direction parallel to the longitudinal axis, and wherein each through opening of the second plurality of through openings is aligned with a through opening of the first plurality of through openings, and wherein each through opening in the third plurality of through openings is aligned with a through opening in the first plurality of through openings.

18. The sensor assembly of claim 17, wherein the first plurality of through openings in the first layer of insulating material includes a first row of circumferentially spaced through openings and a second row of circumferentially spaced through openings and each through opening of the first row of through openings is aligned with a through opening of the second row of through openings in a direction parallel to the longitudinal axis, wherein the second plurality of through openings in the second layer of electrically conductive material includes a first row of circumferentially spaced through openings and a second row of circumferentially spaced through openings and each through opening of the first row of through openings is aligned with a through opening of the second row of through openings in a direction parallel to the longitudinal axis, and wherein the third plurality of through openings in the third layer of electrically insulating material includes a first row of circumferentially spaced through openings and a second row of circumferentially spaced through openings and wherein each through opening of the first row of through openings is aligned with a through opening of the second row of through openings in a direction parallel to the longitudinal axis.

19. The capacitive voltage sensor of claim 18, wherein the flexible tubular section comprises a double-sided printed circuit board.

20. A sensor assembly comprising:
an electrode extending along a longitudinal axis;
a tubular section extending along the longitudinal axis and at least partially surrounding the electrode such that the tubular section is spaced in a direction radially outward from the longitudinal axis and from a portion of the electrode, the tubular section comprising a double-sided printed circuit board wrapped into a tube shape, wherein a layer of copper disposed on an inner side of the printed circuit board and a layer of copper is disposed on an outer opposite side of the printed circuit board, the tubular section including
a first layer of insulating material, wherein the first layer of insulating material has a first plurality of through openings that includes a first row of circumferentially spaced through openings and a second row of circumferentially spaced through openings, each through opening of the first row of through openings aligned with a through opening of the second row of through openings in a direction parallel to the longitudinal axis,
a second layer of electrically conductive material disposed radially inwardly from the inner side of the first layer of insulating material, wherein the second layer of electrically conductive material has a second plurality of through openings that includes a first row of circumferentially spaced through openings and a second row of circumferentially spaced through openings, each through opening of the first row of through openings aligned with a through opening of the second row of through openings in a direction parallel to the longitudinal axis, and
a third layer of electrically conductive material disposed radially outwardly from the outer side of the first layer of insulating material, wherein the third layer of electrically insulating material has a third plurality of through openings that includes a first row of circumferentially spaced through openings and a second row of circumferentially spaced through openings, each through opening of the first row of through openings aligned with a through opening of the second row of through openings in a direction parallel to the longitudinal axis,
wherein each through opening of the second plurality of through openings is aligned with a through opening of the first plurality of through openings, and wherein each through opening in the third plurality of through openings is aligned with a through opening in the first plurality of through openings, and
wherein the first layer of electrically insulating material has a first length extending in a direction parallel to the longitudinal axis, the third layer of electrically conductive material has a second length extending in a direction parallel to the longitudinal axis, and the first length is coextensive with the second length; and
a dielectric material at least partially enclosing the electrode and the flexible tubular section, wherein the dielectric material is molded around and through the tubular section to fill the first plurality of through openings, the second plurality of through openings, and the third plurality of through openings.

21. The sensor assembly of claim 20, wherein each through opening of the first plurality of through openings, the second plurality of through openings, and the third plurality of through openings is configured as an elongated slit having an axial length that extends in a direction parallel to the longitudinal axis.

* * * * *